(12) United States Patent
Silva et al.

(10) Patent No.: US 9,231,614 B2
(45) Date of Patent: Jan. 5, 2016

(54) CANCELLATION OF FEEDBACK DIGITAL-TO-ANALOG CONVERTER ERRORS IN MULTI-STAGE DELTA-SIGMA ANALOG-TO-DIGITAL CONVERTERS

(71) Applicant: ANALOG DEVICES, INC., Norwood, MA (US)

(72) Inventors: Jose Barreiro Silva, Burlington, MA (US); Jialin Zhao, Needham, MA (US); Wenhua W. Yang, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/298,459

(22) Filed: Jun. 6, 2014

(65) Prior Publication Data

US 2015/0288379 A1     Oct. 8, 2015

Related U.S. Application Data

(60) Provisional application No. 61/976,116, filed on Apr. 7, 2014.

(51) Int. Cl.
*H03M 1/06*     (2006.01)
*H03M 3/00*     (2006.01)

(52) U.S. Cl.
CPC ............. *H03M 3/352* (2013.01); *H03M 3/388* (2013.01); *H03M 3/464* (2013.01); *H03M 3/466* (2013.01); *H03M 3/416* (2013.01)

(58) Field of Classification Search
CPC ............ H03M 7/3002; H03M 7/3004; H03M 7/3008; H03M 7/3022; H03M 7/3048; H03M 3/322; H03M 3/464; H03M 3/466
USPC .............................................. 341/77, 118, 143
See application file for complete search history.

(56) References Cited

U.S. PATENT DOCUMENTS

| | | | | |
|---|---|---|---|---|
| 5,061,928 | A * | 10/1991 | Karema et al. | 341/143 |
| 5,153,593 | A * | 10/1992 | Walden et al. | 341/143 |
| 6,518,904 | B1 * | 2/2003 | Jelonnek | 341/143 |
| 6,873,281 | B1 * | 3/2005 | Esterberg et al. | 341/163 |
| 7,084,791 | B2 * | 8/2006 | Cesura et al. | 341/118 |
| 7,532,141 | B2 * | 5/2009 | Kitahira et al. | 341/152 |
| 7,626,525 | B2 * | 12/2009 | Zhou et al. | 341/143 |
| 8,228,221 | B2 * | 7/2012 | Lai et al. | 341/143 |

(Continued)

FOREIGN PATENT DOCUMENTS

EP     454406     10/1991

OTHER PUBLICATIONS

T. Cataltepe et al., "Digitally Corrected Multi-Bit ΣΔ Data Converters", ISCAS '89, CH2692-2/89/0000-0647, $1.00 © 1989 IEEE, 4 pages.

(Continued)

*Primary Examiner* — Khai M Nguyen
(74) *Attorney, Agent, or Firm* — Patent Capital Group

(57) ABSTRACT

The present disclosure describes a mechanism to digitally correct for the static mismatch of the digital-to-analog converter (DAC) in at least the first-stage of a multi-stage noise shaping (MASH) analog-to-digital converter (ADC). The correction is applicable to continuous-time implementations, and is especially attractive for high-speed applications.

23 Claims, 7 Drawing Sheets

(56) References Cited

U.S. PATENT DOCUMENTS

2004/0208249 A1   10/2004   Risbo et al.
2014/0070969 A1    3/2014   Shu

OTHER PUBLICATIONS

John G. Kauffman et al., "An 8.5 mW Continuous-Time ΣΔ Modulator With 25 MHz Bandwidth Using Digital Background DAC Linerarization to Achieve 63.5 dB SNDR and 81 dB SFDR", IEEE Journal of Solid-State Circuits, vol. 46, No. 12, Dec. 2011, 0018/9200/$26.00 (c) 2011 IEEE, pp. 13.

Yun-Shiang Shu et al., "A 28fJ/conv-step CT ΣΔ Modulator with 78dB DR and 18MHz BW in 28nm CMOS Using a High Digital Multibit Quantizer", ISSCC 2013 / Session 15 / Data Converter Techniques / 15.1, 2013 IEEE International Solid-State Circuits Conference, 978-1-4673-4516-3/13/$31.00 (c) 2013 IEEE, 3 pages.

European Search Report issued in European Patent Application Serial No. 15159874.5 mailed Aug. 28, 2015, 12 pages.

C.H. Su et al., "A Fourth-Order Cascaded Sigma-Delta Modulator With DAC Error Cancellation Technique", 0/7803-7523-8/02 © 2002 IEEE, 4 pages.

Nima Maghari et al., "74 dB SNDR Multi-Loop Sturdy-MASH Delta-Sigma Modulator Using 35 dB Open-Loop Opamp Gain", IEEE Journal of Solid-State Circuits, vol. 44, No. 8, Aug. 2009, 0018-9200 © 2009 IEEE, 10 pages.

\* cited by examiner

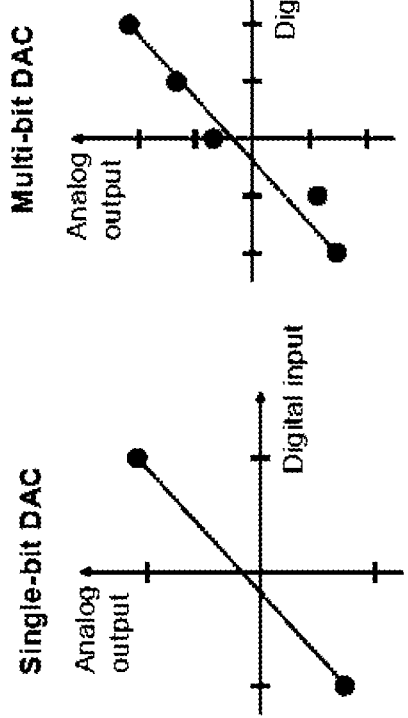
FIG. 2A
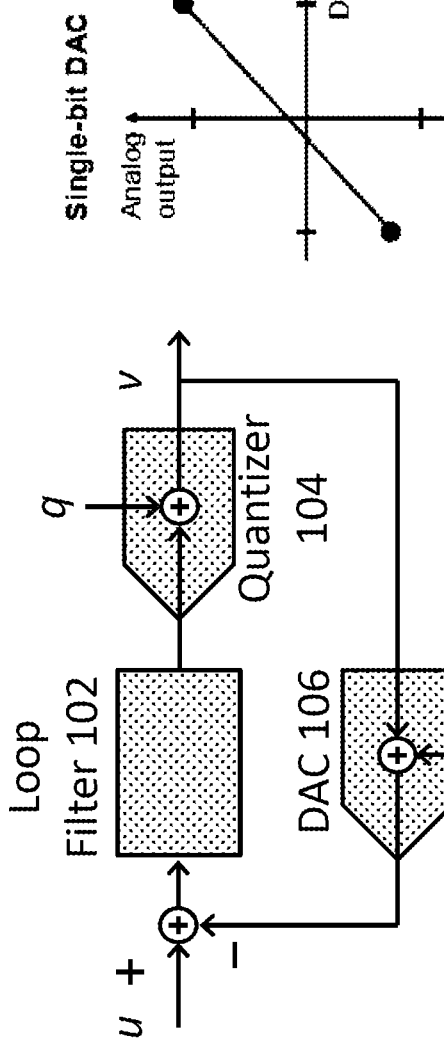
FIG. 2B
FIG. 1
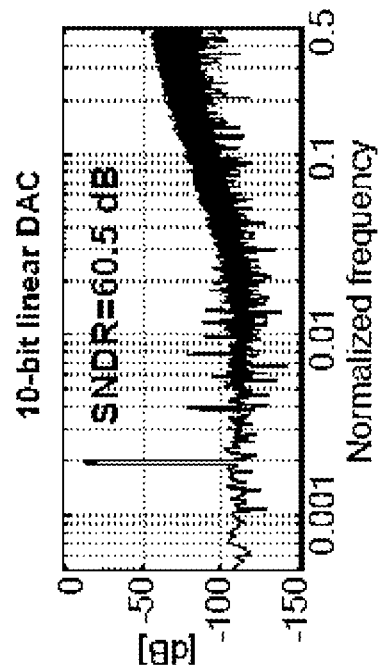
FIG. 3A
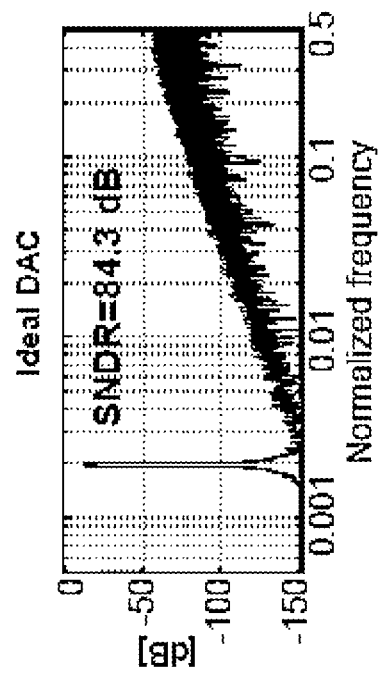
FIG. 3B

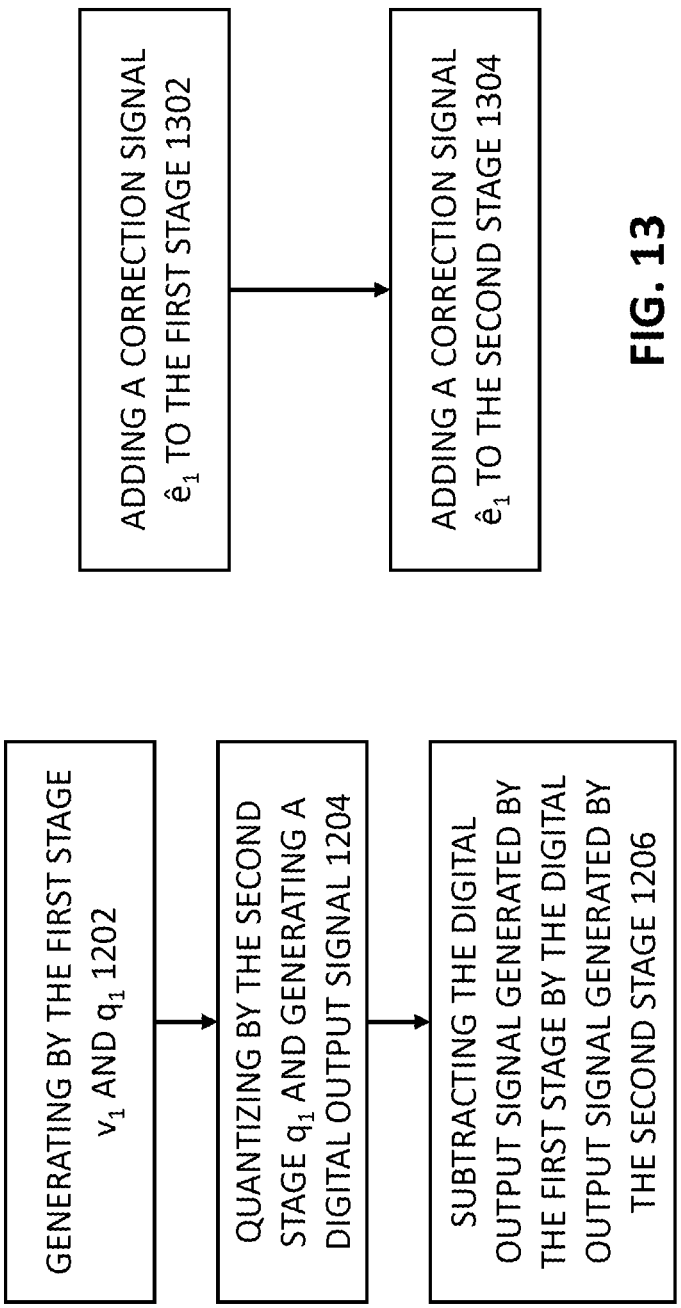

US 9,231,614 B2

CANCELLATION OF FEEDBACK DIGITAL-TO-ANALOG CONVERTER ERRORS IN MULTI-STAGE DELTA-SIGMA ANALOG-TO-DIGITAL CONVERTERS

CROSS-REFERENCE TO RELATED APPLICATION

This non-provisional patent application receives benefit from or claims priority to, under 35 U.S.C. §119(e), U.S. Provisional Patent Application Ser. No. 61/976,116, filed Apr. 7, 2014 and entitled "CANCELLATION OF FEEDBACK DIGITAL-TO-ANALOG CONVERTER ERRORS IN MULTI-STAGE DELTA-SIGMA ANALOG-TO-DIGITAL CONVERTERS", which is hereby incorporated by reference in its entirety.

TECHNICAL FIELD OF THE DISCLOSURE

The present disclosure relates generally to analog-to-digital converters (ADCs) and, more particularly, to the cancellation or reduction of feedback digital-to-analog converter (DAC) errors in continuous-time multiple-stage noise shaping (MASH) delta-sigma (DS) ADCs.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost and size. As the applications needing ADCs grow, the need for accurate and reliable conversion performance also grows.

Overview

The present disclosure describes a mechanism to digitally correct for the static mismatch of the digital-to-analog converter (DAC) in at least the first-stage of a multi-stage noise shaping (MASH) analog-to-digital converter (ADC). The correction is applicable to continuous-time implementations, and is especially attractive for high-speed applications.

BRIEF DESCRIPTION OF THE DRAWING

FIG. 1 is an illustrative system diagram of a delta sigma analog-to-digital converter;

FIG. 2A shows an exemplary plot of the digital inputs versus the analog outputs for a single-bit digital-to-analog converter;

FIG. 2B shows an exemplary plot of the digital inputs versus the analog outputs for a multi-bit digital-to-analog converter;

FIG. 3A shows an illustrative frequency spectrum of an ideal digital-to-analog converter;

FIG. 3B shows an illustrative frequency spectrum of a 10-bit linear digital to analog converter;

FIG. 12 shows a flow diagram illustrating a method for converting an analog input signal into a digital output signal in a multi-stage noise shaping analog-to-digital converter (MASH ADC), according to some embodiments of the disclosure; and FIG. 13 shows a flow diagram illustrating a method for cancelling feedback digital-to-analog converter (DAC) errors in a multi-stage noise shaping analog-to-digital converter (MASH ADC), according to some embodiments of the disclosure.

DESCRIPTION OF EXAMPLE EMBODIMENTS OF THE DISCLOSURE

Basics of Analog-to-Digital Converters (ADCs)

Figure 4:
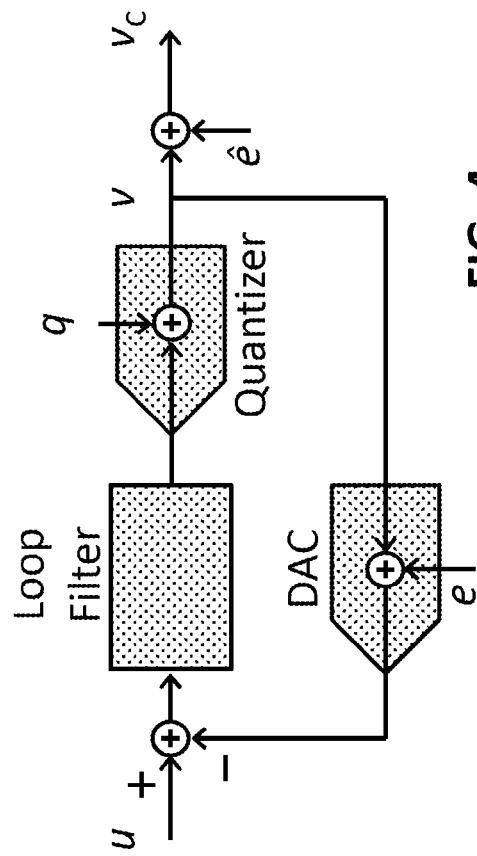
FIG. 4 shows an illustrative system diagram of a delta-sigma analog-to-digital converter having error correction for the feedback digital-to-analog converter.

Analog to digital converters (ADCs) are electronic devices that convert a continuous physical quantity carried by an analog signal to a digital number that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal.

An ADC is usually defined by the following application requirements: its bandwidth (the range of frequencies of analog signals it can properly convert to a digital signal), its resolution (the number of discrete levels the maximum analog signal can be divided into and represented in the digital signal), and its signal to noise ratio (how accurately the ADC can measure signal relative to the noise the ADC introduces). Analog-to-digital converters (ADCs) have many different designs, which can be chosen based on the application requirements.

Delta-Sigma Analog-to-Digital Converters (DS ADCs)

Analog-to-digital converters (ADCs) based on delta-sigma (DS) modulation (referred to herein as "DS ADCs") have been widely used in digital audio and high precision instrumentation systems. FIG. 1 is an illustrative system diagram of a delta sigma analog-to-digital converter (DS ADC). The DS ADC includes loop filter 102, quantizer 104, and feedback digital-to-analog converter (DAC) 106 (i.e., a DAC in the feedback path of the DS ADC).

A DS ADC usually provides the advantage of being able to convert an analog input signal to a digital signal with high resolution at low cost. Typically, a DS ADC encodes an analog signal u using a DS modulator. Quantizer 104 can be used for this purpose, employing, e.g., a low resolution ADC, as a 1-bit ADC, Flash ADC, Flash quantizer, etc. Then, if applicable, the DS ADC can apply a digital filter (not shown) to the output of the DS modulator (i.e., Quantizer 104) to form a higher-resolution digital output. Loop filter 102, having one or more integrators, may be included to provide error feedback for the DS ADC and to help shape the noise from the quantizer 106 out of baseband to higher frequencies. The error is usually generated by taking the difference between the original analog input signal u and a reconstructed version of the original analog input signal generated using the feedback DAC 106 (where digitized signal v is converted back into an analog signal). One key characteristic of a DS ADC is its ability to push the quantization noise q (from quantizer 104) to higher frequencies, also referred to as noise shaping. The amount of noise shaping depends on the order of the loop filter 102. As a result, DS ADCs are generally able to achieve high resolution analog-to-digital conversion. Due to its popularity, many variations on the DS ADC and structures employing the DS ADC have been proposed.

Noise from Feedback Digital-to-Analog Converter (DAC)

The feedback digital-to-analog converter (e.g., DAC 106 of FIG. 1) is, in some cases, not ideal. Although the DS ADC, in particular, the loop filter, is able to shape the noise from the quantizer 104, the DS ADC does not correct for nor shape the error e from the feedback DAC 106. As a result, the error e from DAC 106 shows up at the digital output v. In other words, without further modifications to the DS ADC, the DS ADC may require the feedback DAC to be as good as the overall DS ADC.

FIG. 2A shows an exemplary plot of the digital inputs versus the analog outputs for a single-bit digital-to-analog converter. In some implementations, the feedback DAC 106 is implemented with a single bit DAC. In these implementations, the error is not a significant issue due to the linearity of the single-bit DAC (as seen in the plot, there are only two dots, so they always match a perfect line). However, as the demands of performance and resolution of ADCs rises, later implementations use a multi-bit DAC. FIG. 2B shows an exemplary plot of the digital inputs versus the analog outputs for a multi-bit digital-to-analog converter. As seen in the plot, the multi-bit DAC exhibits errors (i.e., as seen by the spacing between the dots and the line). Efforts have been made to adjust the inputs/outputs of the DAC or calibrate the DAC to force the DAC to have an ideal behavior.

FIG. 3A shows an illustrative frequency spectrum of an ideal digital-to-analog converter. As seen in this ideal spectrum, there is a strong peak for the signal, and a normal noise profile. FIG. 3B shows an illustrative frequency spectrum of a 10-bit linear digital to analog converter. As seen in this spectrum, while there is a strong signal, there are several harmonics present which can cause serious errors in the DAC. The signal-to-noise and distortion ratio of the 10-bit linear DAC (60.5 dB versus 84.3 dB of the ideal DAC) is less than ideal for the 10-bit linear digital-to-analog converter.

Multi-Stage Noise Shaping Analog-to-Digital Converters (MASH ADCs)

Different variations on the DS ADC have been proposed to achieve various advantages suitable for a variety of systems. Some DS ADCs have been concerned with power, while some other DS ADCs are concerned with complexity. In some cases, DS ADCs have been concerned with precision, i.e., control over errors and/or noise. For example, for applications with an emphasis on noise shaping, a higher order DS modulator may be used, i.e., more integrators and feedback paths are used in the loop filter for shaping even more of the quantization noise to high frequencies.

One group of structures have been proposed for DS ADCs—multi-stage noise shaping (MASH) ADCs—with some variations having a front-end and a back-end where inputs to each modulator differ, and/or the implementation of the stage may differ. Generally speaking, MASH ADCs can include a plurality of stages for digitizing the signal and errors of the system in order to meet design requirements related to bandwidth, resolution, and the signal to noise ratios. One advantage of MASH ADCs is that the design cascades stable low-order loops while achieving the good performance of (potentially unstable) higher-order loops. One or more of these stages typically uses the original analog input signal as a reference signal to produce a residual signal (i.e., an error between a reconstructed version of the analog input signal) in order to reduce the amount of noise introduced by the ADC and/or to increase the resolution of the output.

From the analog input signal, the first stage generates a digital output signal using a first ADC. The input of the quantizer in the first stage (e.g., an analog input signal) can be subtracted from the first DAC analog output to yield the first stage quantization noise. The result is that the first stage generates an analog signal representing its quantization noise, and the second stage quantizes the quantization noise of the first stage using a second ADC. The multi-stage approach allows the quantization noise to be reduced and thus allows the MASH ADC to achieve higher performance. If more stages are used, the input of the quantizer in the second stage can be subtracted from the second DAC analog output to yield the second stage quantization noise which can be in turn quantized by a third stage. Effectively, the result is that the quantization noise of the first stage is suppressed by the second stage, and the quantization noise from the second stage is suppressed by the third stage (yielding the same suppression of noise as a single third-order loop, even though more stable three first-order loops are used instead).

While providing multiple stages increases complexity and cost, MASH ADCs can achieve remarkable performance. However, many of these MASH ADC structures still suffer from some shortcomings. For instance, a conventional MASH ADC sometimes has challenges in adequately correcting the error from the feedback DAC in the DS ADC at any of the stages.

For this reason, one of the critical goals in the design of multi-bit delta-sigma ADCs is to reduce the impact that the limited linearity in the main feedback DAC has on the overall ADC performance (i.e., to correct or alleviate issues caused by the noise in the main feedback DAC). The mismatch errors from the main DAC are not shaped by the modulator, so the errors may need to be reduced by a linearization technique.

Digital Error Correction for Delta-Sigma ADCs and Issues Thereof

Before diving into how this error from the feedback DAC in a MASH ADC can be corrected effectively (i.e., the subject of the present disclosure), various general techniques to correct the error for a (single stage) DS ADC are described. The conventional approach is to use a form of Dynamic Element Matching (DEM) to shape the DAC errors, but this requires some digital signal processing implemented within the feedback loop, and the continuous trend for faster ADCs makes the required timing constraints increasingly difficult to meet.

Figure 5:
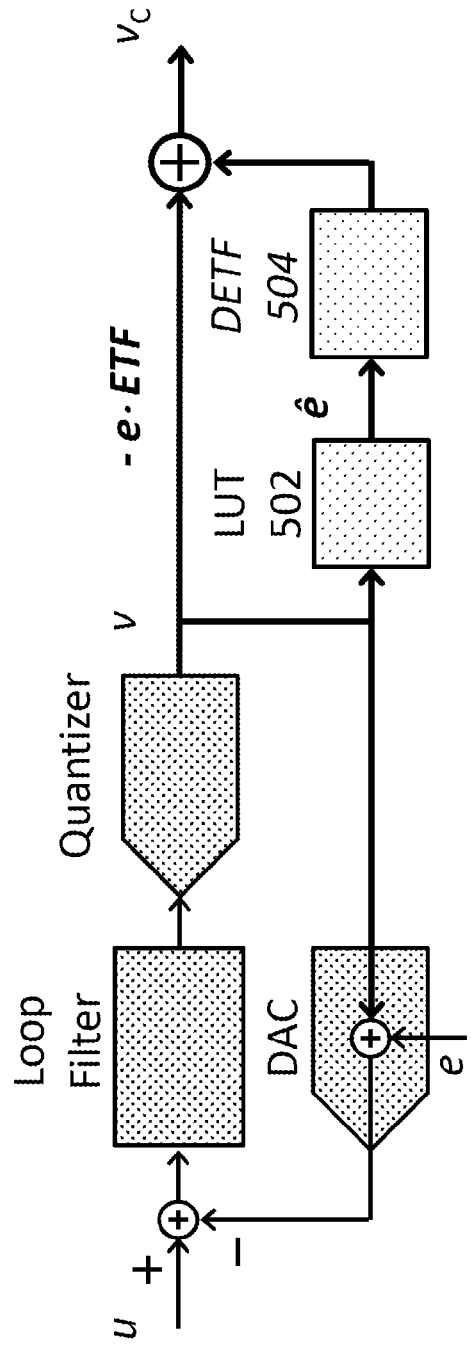
FIG. 5 shows an illustrative system diagram of a delta-sigma analog-to-digital converter implementing error correction.

FIG. 4 shows an illustrative system diagram of a delta-sigma analog-to-digital converter having error correction for the feedback digital-to-analog converter. In this system, an error $\hat{e}$ is added to the digital output signal v to build a corrected digital output. FIG. 5 shows an illustrative system diagram of a delta-sigma analog-to-digital converter implementing error correction, i.e., to properly provide the error $\hat{e}$. During a digital estimation procedure that may be performed offline or online, the DAC errors are measured and stored in a Look-Up Table (LUT) 502. During normal ADC operation, accordingly to the DAC element selection, the corresponding errors are selected from the LUT 502 (based on the signal v), and the error is added directly at the modulator output. If the error transfer function (ETF) from the DAC to the output of the modulator is known and implementable in digital domain (e.g., as DETF 504), it may be included as depicted in FIG. 5 to completely suppress the errors.

In continuous-time modulators, the DETF 504 is complicated and costly to implement. In many cases ETF or DETF 504 is unknown or impossible/impractical to implement and thus some implementations omit DETF 504 altogether. If not included, the DAC errors simply become shaped by (1-ETF), a high-pass transfer function which approximately matches the modulator's noise transfer function (NTF) in the desired input signal band or—with proper compensation—can be made fully equivalent to the NTF. The resulting suppression may be acceptable. The correction is implemented in open loop and may even be performed as a post-data-acquisition step, making it desirable for high-speed implementations.

Understanding Error from the Feedback DAC in Multi-Stage Noise Shaping Analog-to-Digital Converters (MASH ADCs)

MASH ADCs rely on the cascading of individual delta-sigma modulators (any one of the modulators can be of $0^{th}$ order, $1^{st}$ order, $2^{nd}$ order, $3^{rd}$ order, or more) to achieve high-order noise shaping and high effective quantizer resolution, without concern for the stability issues found in single-loop high-order delta-sigma modulators. However, the linearity of the DAC in the first ADC determines the overall linearity of the MASH ADC, and suffers from the same concerns described above for single-loop modulators. For similar reasons, the errors caused by the non-linear feedback DAC ought to be compensated to provide overall linearity and performance of the MASH ADC.

Figure 6:
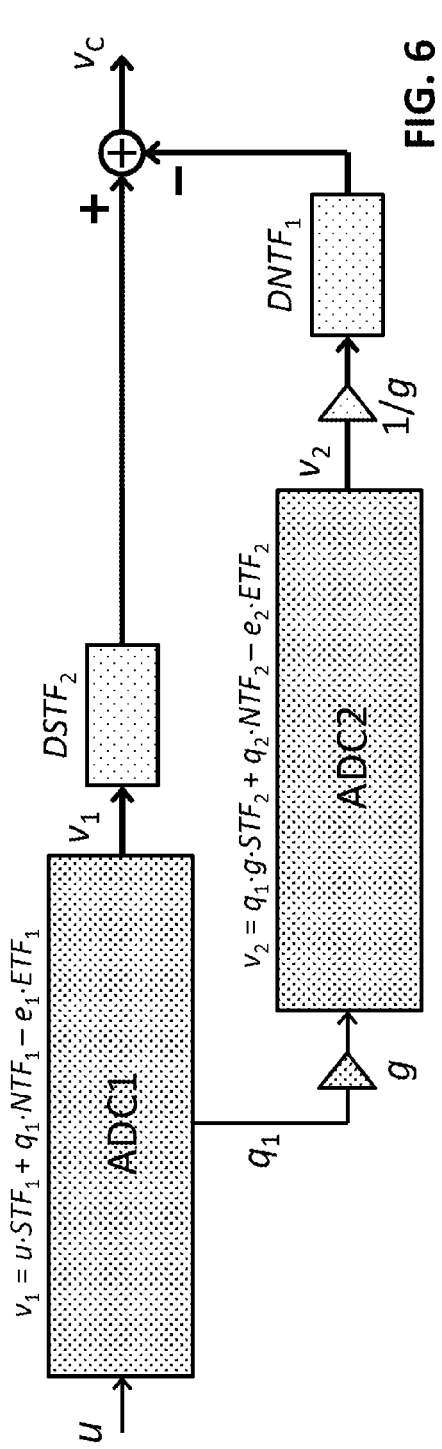
FIG. 6 shows an illustrative system diagram of a multi-stage noise shaping analog-to-digital converter.

FIG. 6 shows an illustrative system diagram of a multi-stage noise shaping analog-to-digital converter. This MASH ADC as shown has two stages, and thus, has two ADCs: ADC1 and ADC2. The first stage having ADC1 produces a digital output signal $v_1$ from the analog input signal and an analog signal $q_1$ representing the quantization noise of the first stage. The second stage quantizes the quantization noise from the first stage using ADC2 of the second stage. The digital output signal produced by the first stage is subtracted by the digital output signal produced by the second stage. Effectively, the subtraction allows the quantization noise to be cancelled (or subtracted) from the digital signal to generate an improved signal $v_c$.

Each (DS or non-DS) ADC has a signal transfer function (STF) from its input to its output. The quantization noise q introduced by the quantizer in each ADC appears at its output shaped by a noise transfer function (NTF). The static errors introduced by the DAC (e) are shaped by an error transfer function (ETF). The transfer functions denoted by $DSTF_1$ and $DNTF_1$ correspond to digital implementations of their corresponding analog counterparts ($STF_1$ and $NTF_1$ respectively). All of these terms are discrete-time transfer functions or equivalent discrete-time representations of continuous-time transfer functions.

Consider a MASH ADC without any form of DAC correction. The combined digital output $v_c$ is given as:

$$v_c = v_1 DSTF_2 - \frac{v_2}{g} DNTF_1 =$$
$$= uSTF_1 DSTF_2 + q_1(NTF_1 DSTF_2 - STF_2 DNTF_1) -$$
$$\frac{q_2}{g} NTF_2 DNTF_1 - e_1 ETF_1 DSTF_2 + \frac{e_2}{g} ETF_2 DNTF_1$$

If the analog and digital transfer functions are made to match perfectly, i.e., if $DNTF_1=NTF_1$ and $DSTF_2=STF_2$, the above expression simplifies to:

$$v_c = uSTF_1 DSTF_2 - \frac{q_2}{g} NTF_2 DNTF_1 - e_1 ETF_1 DSTF_2 + \frac{e_2}{g} ETF_2 DNTF_1$$

Therefore, the quantization noise from the first stage is cancelled out (no $q_1$ term), while the quantization noise ($q_2$) from the second stage is scaled down by the inter-stage gain factor g and shaped by the product of the two noise transfer functions (as indicated by $q_2/gNTF_2 DNTF_1$). The error signals produced by the nonlinear DACs appear at the output as terms of $e_1$ and $e_2$. The latter $e_2$ can be considered negligible as it is also reduced by the inter-stage gain factor g and further shaped by the digital noise transfer function $DNTF_1$. As stated earlier, the error signal produced by the first-stage DAC ($e_1$) does not get reduced or shaped, and results in a term $e_1 ETF_1 DSTF_2$. The feedback DAC error should be handled adequately.

Assume that the same digital correction technique described above for DS ADCs is employed in a continuous-time MASH ADC. That is to say, the DAC errors are added at the output of the first stage, or equivalently at the output of the MASH. In that case, the errors are shaped only by the NTF of the first stage, and not by the overall MASH NTF (superior to the NTF of the first stage). As an example, a 1-2 MASH ADC (cascade of first-order and second-order modulators) will implement an overall third-order NTF, but the first-stage DAC errors are only first-order shaped. For this reason, the conventional technique is inadequate.

An Improved Mechanism for Cancelling Error from the Feedback DAC in a MASH ADC

Figure 7:
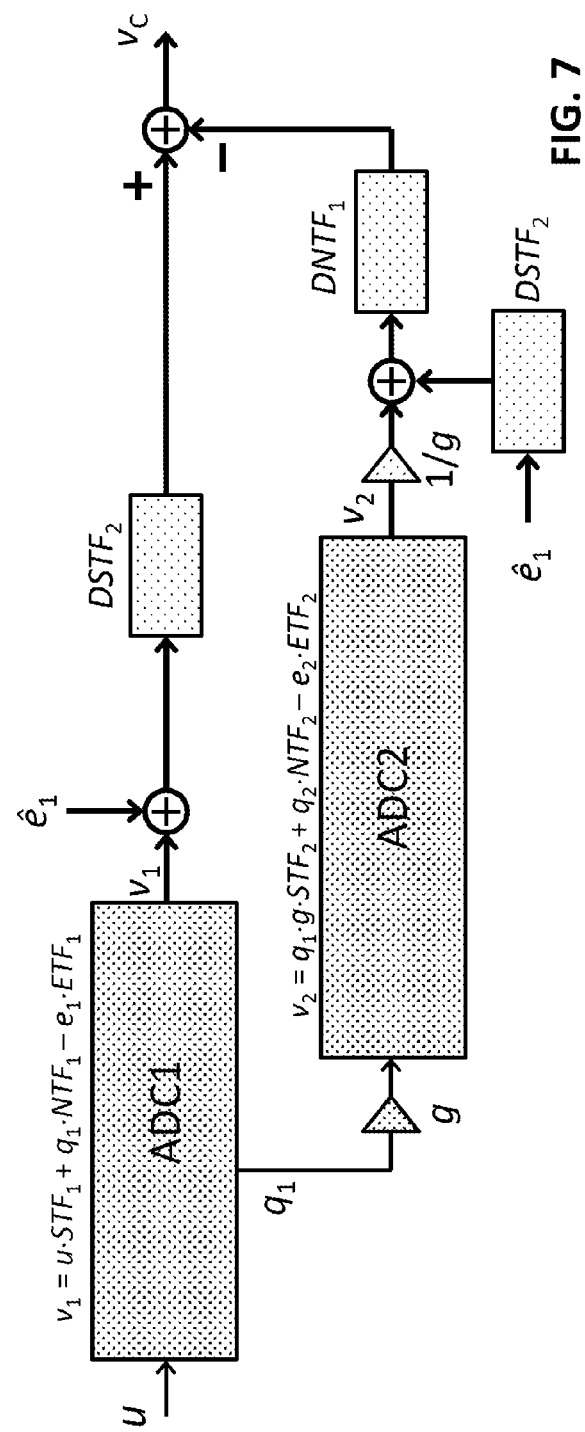
FIG. 7 shows an illustrative system diagram of a multi-stage noise shaping analog-to-digital converter with error correction for the feedback digital-to-analog converter, according to some embodiments of the disclosure.

The present disclosure describes a technique to (substantially fully) cancel the DAC errors from the first stage in continuous-time MASH implementations. The desired correction is achieved by adding the DAC errors in the first stage and in the second stage (e.g., at the output of the first stage, and at the output of second stage before the digital noise-transfer function), as illustrated in FIG. 7. FIG. 7 shows an illustrative system diagram of a multi-stage noise shaping analog-to-digital converter with error correction for the feedback digital-to-analog converter (of the first stage), according to some embodiments of the disclosure. In particular, the estimated error $\hat{e}_1$ (or correction signal, where the term is used interchangeably within this disclosure) is added at the output of ADC1 (e.g., the estimated error is added to $v_1$), and the estimated error $\hat{e}_1$ is filtered by $DSTF_2$ and then added to the output the second stage before $DNTF_1$ (e.g., the estimated error is added to a digital output signal represented by the digital output of ADC2 divided by an inter-stage gain factor g, $v_2/g$). In other words, the estimated error $\hat{e}_1$ is added to the system twice: in the first stage (e.g., at the output of the first stage) and in the second stage (e.g., at the output of the second stage before $DNTF_1$). In this way, the DAC errors are processed separately by the analog NTF of the first stage, and by the digital NTF of the first stage. As long as the analog and digital NTFs match, the errors $e_1$ will be cancelled in the same way as the quantization noise from the first stage ($q_1$).

Assuming that the estimation of the DAC errors in the first stage is perfect (i.e., that $\hat{e}_1 = e_1$), the combined output $v_c$ is as follows (the $q_1$ and $e_2$ terms are not shown to improve readability. The term $q_1$ is assumed to be cancelled and $e_2$ is shaped as explained above).

$$v_c = (v_1 + \hat{e}_1)DSTF_2 - \left(\frac{v_2}{g} + \hat{e}_1 DSTF_2\right)DNTF_1 =$$

$$= uSTF_1 DSTF_2 - \frac{q_2}{g}NTF_2 DNTF_1 +$$

$$e_1(1 - ETF_1)DSTF_2 - e_1 DSTF_2 DNTF_1$$

A key insight for the above equation, as described earlier, is that the $(1-ETF_1)$ term may be rewritten as $NTF_1$. Under that condition, the combined output $v_c$ simplifies to:

$$v_c = uSTF_1 DSTF_2 - \frac{q_2}{g}NTF_2 DNTF_1 + e_1 DSTF_2(NTF_1 - DNTF_1)$$

$$= uSTF_1 DSTF_2 - \frac{q_2}{g}NTF_2 DNTF_1$$

As long as the DAC errors are estimated accurately, and as long as the digital noise transfer function $DNTF_1$ matches the analog noise transfer function $NTF_1$ (as required for adequate suppression of quantization noise), the MASH output $v_c$ will not contain the DAC errors from the first stage (as indicated by the term $e_1 DSTF_2(NTF_1-DNTF_1)=0$, assuming $NTF_1=DNTF_1$). Knowledge of the error transfer function $ETF_1$ (and $DETF_1$) is not needed, and any techniques aimed at improving the matching between the analog and digital noise transfer functions will also improve the suppression of the DAC errors.

Figure 8:
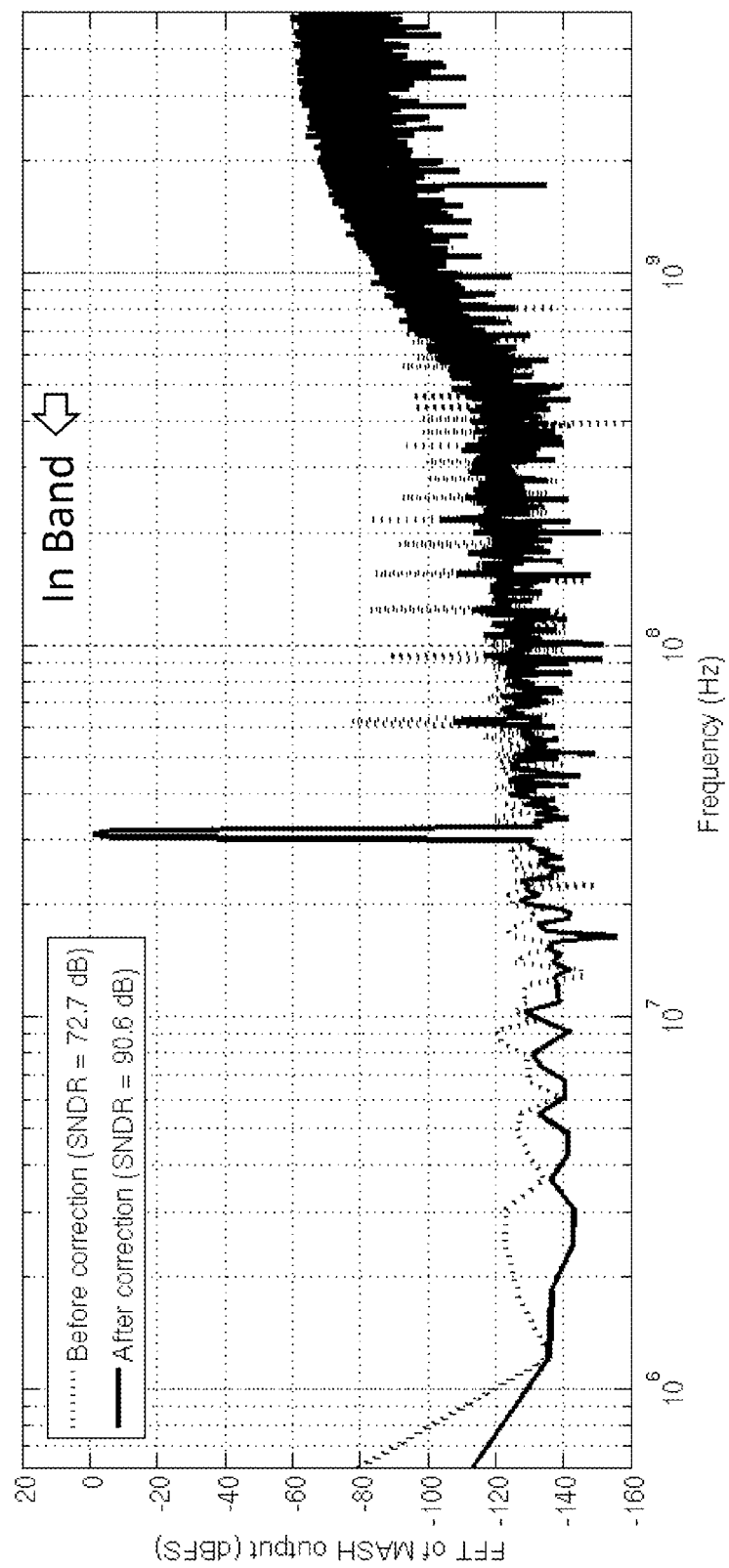
FIG. 8 shows exemplary results of a multi-stage noise shaping analog-to-digital converter without error correction and a multi-stage noise shaping analog-to-digital converter with error correction for the feedback digital-to-analog converter, according to some embodiments of the disclosure.

FIG. 8 shows exemplary results of a multi-stage noise shaping analog-to-digital converter without error correction (dotted line plot) and a multi-stage noise shaping analog-to-digital converter with error correction for the feedback digital-to-analog converter (solid line plot), according to some embodiments of the disclosure. In particular, the FIGURE illustrates the effectiveness of the described technique with simulation results from a high-level model of a 1-2 MASH ADC. The MASH ADC is designed to provide a signal bandwidth of 500 MHz based on a sample rate of 10 GS/s. The main DAC in the first stage may include 16 elements with static errors sampled from a normal distribution with standard deviation of 0.2%. Without correction, these errors limit the inband signal-to-noise-and-distortion ratio (SNDR) to 72.7 dB (dotted line in the plot shows various harmonics present in the noise profile). Using the described technique, the SNDR is improved to 90.6 dB (the solid line shows an improved noise profile with far less harmonics present). In this example, the DAC errors in the first stage are not exactly shaped by $NTF_1$, so the cancellation is not perfect, some residual harmonics remain in the corrected output, but their impact on the overall performance is negligible. The simulation does not include any other non-ideal effects.

Exemplary Implementations and Variations

Figure 9:
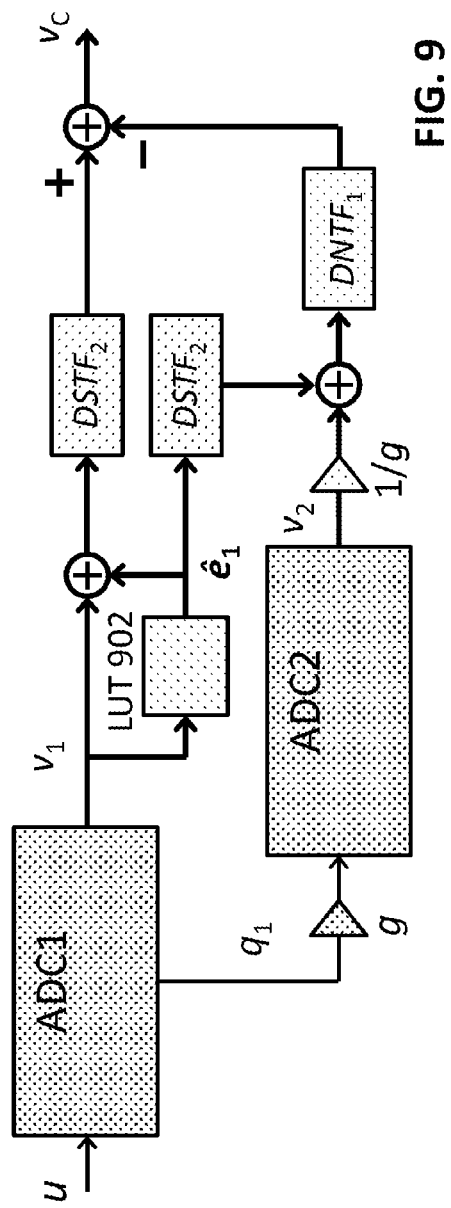
FIG. 9 shows an illustrative implementation of a multi-stage noise shaping analog-to-digital converter with error correction for the feedback digital-to-analog converter, according to some embodiments of the disclosure.

FIG. 9 shows an illustrative implementation of a multi-stage noise shaping analog-to-digital converter with error correction for the feedback digital-to-analog converter, according to some embodiments of the disclosure. In this implementation, the DAC errors may be stored in a look up table (shown as LUT 902) which is used as the source of the correction signal $\hat{e}_1$ for both injection points. Specifically, LUT 902 may store possible values of $v_1$ and value for $\hat{e}_1$ corresponding to the possible values of $v_1$. These values for $\hat{e}_1$ corresponding to possible values of $v_1$ may be generated offline, e.g., during calibration, and/or online, according to any suitable method. Taking $v_1$ as input, LUT 902 can provide a corresponding $\hat{e}_1$ as output. The error $\hat{e}_1$ can then be added at the output of first stage (having ADC1), i.e., to digital output signal $v_1$. This same error signal $\hat{e}_1$ can also be added to the output of the second stage (having ADC2), i.e., to digital output signal $v_2/g$ before $DNTF_1$.

For many implementations shown in this present disclosure, an LUT is used for providing the estimated error $\hat{e}_1$. Instead of using LUT 902 to generate $\hat{e}_1$, other methods can be used to provide $\hat{e}_1$. For instance, a function can be provided which takes $v_1$ as an input and outputs a value for $\hat{e}_1$.

Figure 10:
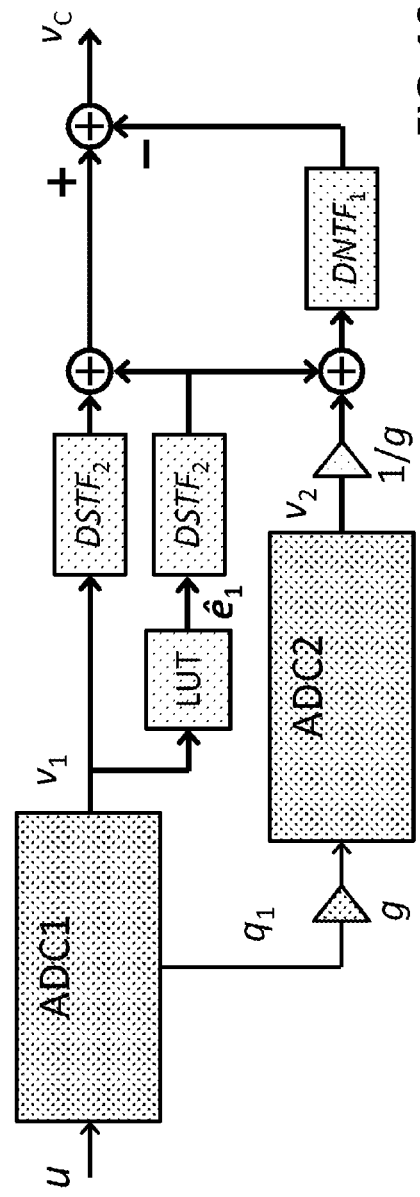
FIG. 10 shows another illustrative implementation of a multi-stage noise shaping analog-to-digital converter with error correction for the feedback digital-to-analog converter, according to some embodiments of the disclosure.

In the above case as shown in FIG. 9, the digital block $DSTF_2$ in the main path processes the corrected signal $v_1+\hat{e}_1$. Such an implementation could require a computationally-intensive implementation. This is because the signals $v_1$ and $\hat{e}_1$ have very different scales, so their combination produces a very wide dynamic range signal. For this reason, a computationally intensive $DSTF_2$ may be needed to process $v_1+\hat{e}_1$. A more efficient implementation of the technique is shown in FIG. 10. FIG. 10 shows another illustrative implementation of a multi-stage noise shaping analog-to-digital converter with error correction for the feedback digital-to-analog converter, according to some embodiments of the disclosure. In this case, $v_1$ and $\hat{e}_1$ are processed separately by two separate $DSTF_2$ blocks and are only combined afterwards, making the two $DSTF_2$ blocks simpler to implement.

Figure 11:
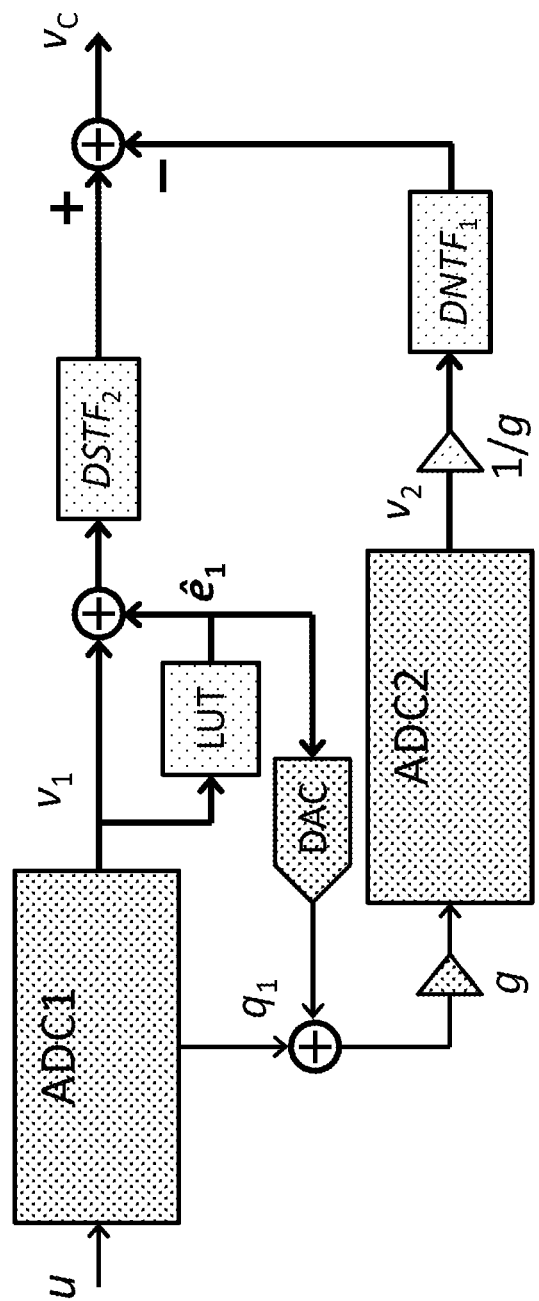
FIG. 11 shows yet another illustrative implementation of a multi-stage noise shaping analog-to-digital converter with error correction for the feedback digital-to-analog converter, according to some embodiments of the disclosure.

FIG. 11 shows yet another illustrative implementation of a multi-stage noise shaping analog-to-digital converter with error correction for the feedback digital-to-analog converter, according to some embodiments of the disclosure. The error signal can be added to the second stage even before ADC2 (instead of after ADC2, as shown in FIGS. 9-10). In this implementation, $\hat{e}_1$ is added to $q_1$ at the input of the second stage (before gain factor g). To add $\hat{e}_1$, $\hat{e}_1$ is first provided to a digital to analog converter to generate an analog version of $\hat{e}_1$. Then the analog version of $\hat{e}_1$ is added to $q_1$. Because $\hat{e}_1$ will be processed by the second stage, rather than having $\hat{e}_1$ be processed by $DSTF_2$, $\hat{e}_1$ would be processed by $STF_2$ (equivalent to $DSTF_2$). The end result is equivalent to the implementations seen in FIGS. 9-10. In a similar fashion, $\hat{e}_1$ would be shaped and then be used to cancel the noise shaped error $\hat{e}_1$ from the first stage.

The proposed technique can be used in MASH ADCs with any number of stages (and with stages having any suitable order). For cancellation of the DAC errors in the first stage, the estimated errors are added only at the first and second stage as described above. As an example, to cancel DAC errors in the second stage, the estimated errors can be added to the second and the third stage in a similar fashion (using implementations outlined in relation to FIGS. 9-11). The only difference is that additional DSTF stages may be added to both DAC correction paths, if applicable, by the number of stages in the implementation.

Improved Method for Cancelling Feedback DAC Errors in a MASH ADC

FIG. 12 shows a flow diagram illustrating a method for converting an analog input signal into a digital output signal in a multi-stage noise shaping analog-to-digital converter (MASH ADC), according to some embodiments of the disclosure. The MASH ADC includes a first stage and a second stage with a first ADC and a second ADC respectively. The first stage having a feedback DAC, which exhibits some error. The method comprises generating, by the (first ADC of the) first stage, a digital output signal $v_1$ and an analog signal $q_1$ representing quantization noise of the first stage (box 1202). The method further includes quantizing, by the (second ADC of the) second stage, the analog signal $(q_1)$ representing the quantization noise of the first stage and generating a digital output signal (box 1204). The method further includes subtracting the digital output signal generated by the first stage by the digital output signal of the second stage (box 1206). This method can be applied to further stages in a MASH ADC. For instance, the method can be implemented in a similar fashion to the second stage and a third stage, the third stage and a fourth stage, and so on.

FIG. 13 shows a flow diagram illustrating a method for cancelling feedback digital-to-analog converter (DAC) errors in a multi-stage noise shaping analog-to-digital converter (MASH ADC), according to some embodiments of the disclosure. In particular, the MASH ADC includes a first stage with a first ADC and a feedback ADC which exhibits errors, and a second stage with a second ADC. The first stage generates a digital output signal $(v_1)$ and an analog signal $(q_1)$ representing its quantization noise, and the second stage quantizes the quantization noise of the first stage. The digital output signal generated by the first stage is subtracted by a digital output signal of the second stage. The method includes adding a correction signal $\hat{e}_1$ to the first stage (e.g., to the digital output signal $v_1$ of the first ADC) (box 1202). The method further includes adding the correction signal $\hat{e}_1$ to the second stage (e.g., to a digital output signal of the second stage, $v_2/g$) (box 1204). The subtraction of the digital output signal of the first stage by the digital output signal of the second stage (both now including the correction signal) allows the feedback DAC errors to be cancelled out. This method can be applied to further stages in a MASH ADC. For instance, the method can be implemented in a similar fashion to the second stage and a third stage, the third stage and a fourth stage, and so on.

Other Implementation Notes, Variations, and Applications

In the discussions of the embodiments above, the capacitors, clocks, DFFs, dividers, inductors, resistors, amplifiers, switches, digital core, transistors, and/or other components/blocks can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or the summary of features. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or the summary of features. The description and drawings are, accordingly, to be regarded in an illustrative rather than in a restrictive sense.

The present architecture for cancellation of feedback DAC errors are particularly suitable for high speed, continuous-time, high precision applications where MASH ADCs are used. Applications which can greatly benefit from the architecture include: instrumentation, testing, spectral analyzers, military purposes, radar, communications, mobile telephones (especially because standards continues to push for higher speed communications), and base stations.

Note that the activities discussed above with reference to the FIGURES are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to cancellation of noise shaped errors from feedback DACs in a MASH ADC, such as the processes shown in FIG. 12, illustrate only some of the possible functions that may be executed by, or within, systems illustrated in FIGS. 7, and 9-11. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) or the summary of features. In order to assist the United States Patent and Trademark Office (USPTO) and, additionally, any readers of any patent issued on this application in interpreting the claims (if any) or the summary of features appended hereto, Applicant wishes to note that the Applicant: (a) does not intend any of the appended claims (if any) or the summary of features to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims (if any) or the summary of features.

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

Summary of Features

Example 1 is a method for cancelling feedback digital-to-analog converter (DAC) errors in a multi-stage noise shaping analog-to-digital converter (MASH ADC). The MASH ADC includes a first stage and a second stage with a first ADC and a second ADC respectively. Furthermore, the first stage has the feedback DAC which exhibit errors. The first stage generates a digital output signal ($v_1$) (e.g., by converting an analog input signal to the digital output signal using the first ADC) and an analog signal ($q_1$) representing its quantization noise. The second stage quantizes the quantization noise of the first stage and generates a digital output signal of the second stage (e.g., by converting the analog signal representing the quantization noise of the first stage to a digital output signal of the second stage using the second ADC). The digital output signal generated by the first stage is subtracted by a digital output signal of the second stage. The method includes adding a correction signal $\hat{e}_1$ to the first stage (e.g., to the digital output ($v_1$) of the first ADC) and to the output of the second stage (e.g., to a digital output signal of the second stage, $v_2/g$).

In Example 2, the subject matter of Example 1 can optionally include: the correction signal $\hat{e}_1$ added to the first stage is processed by the signal transfer function of the second stage.

In Example 3, the subject matter of Example 1 or 2 can optionally include: the correction signal $\hat{e}_1$ added to the second stage is processed by the signal transfer function of the second stage and shaped by the noise transfer function of the first stage.

In Example 4, the subject matter of any one of Examples 1-3 can optionally include: the subtraction of the digital output signal generated by the first stage having the correction signal $\hat{e}_1$ by the digital output signal of the second stage having the correction signal $\hat{e}_1$ substantially cancels the feedback DAC error of the first stage.

In Example 5, the subject matter of any one of Examples 1-4 can optionally include: adding a correction signal $\hat{e}_1$ to the digital output signal of the first stage, and adding the correction signal $\hat{e}_1$ to the digital output signal of the second stage before a digital noise transfer function of the first stage.

In Example 6, the subject matter of Example 5 can optionally include: the correction signal $\hat{e}_1$ is shaped by an analog noise transfer function of the first stage, and separately, the correction signal $\hat{e}_1$ is shaped by the digital noise transfer function of the first stage.

In Example 7, the subject matter of any one of Examples 1-6 can optionally include: the correction signal $\hat{e}_1$ is to be provided by a look-up table or a function.

In Example 8, the subject matter of any one of Examples 1-7 can optionally include processing the digital output signal of the first ADC and the correction signal $\hat{e}_1$ together by a digital signal transfer function of the second stage.

In Example 9, the subject matter of any one of Examples 1-8 can optionally include processing the digital output signal of the first ADC and the correction signal $\hat{e}_1$ by (2) separate digital signal transfer functions of the second stage.

In Example 10, the subject matter of any one of Examples 1-9 can optionally include converting the correction signal $\hat{e}_1$ to an analog version of the correction signal using a digital-to-analog converter and adding the analog version of the correction signal to the input of the second stage.

Example 11 is a multi-stage noise shaping analog-to-digital converter implementing the method of any one of the above examples.

What is claimed is:

1. A method for cancelling feedback digital-to-analog converter (DAC) errors in a multi-stage noise shaping analog-to-digital converter (MASH ADC), the MASH ADC includes a first stage with a first ADC and a feedback DAC and a second stage with a second ADC, the method comprises:
   adding, to the first stage, a correction signal for correcting an error of the feedback DAC in the first stage, wherein the first stage is configured to generate a first digital output signal and an analog signal representing quantization noise of the first stage; and
   adding the correction signal to the second stage, wherein the second stage is configured to quantize the analog signal representing the quantization noise of the first stage and generate a second digital output signal;
   wherein the MASH ADC subtracts the first digital output signal by the second digital output signal.

2. The method of claim 1, wherein:
   adding the correction signal to the first stage comprises adding the correction signal to a digital output signal of the first ADC.

3. The method of claim 1, wherein:
   adding the correction signal to the second stage comprises adding the correction signal to the second digital output signal, wherein the second digital output signal is represented by a digital output signal of the second ADC divided by an inter-stage gain factor between the first stage and the second stage.

4. The method of claim 1, wherein:
   adding the correction signal to the second stage comprises adding the correction signal to the second digital output signal before the second digital output signal is shaped by a digital noise transfer function of the first stage, wherein the second digital output signal is represented by a digital output signal of the second ADC divided by the inter-stage gain factor between the first stage and the second stage.

5. The method of claim 1, wherein:
   the correction signal added to the first stage is processed by a signal transfer function of the second stage.

6. The method of claim 1, wherein:
   the correction signal added to the second stage is processed by a signal transfer function of the second stage and shaped by a noise transfer function of the first stage.

7. The method of claim 1, wherein:
   subtracting the first digital output signal having the correction signal by the second digital output signal having the correction signal substantially cancels the feedback DAC error of the first stage.

8. The method of claim 1, wherein:
   the correction signal is shaped by an analog noise transfer function of the first stage; and
   separately, the correction signal is shaped by the digital noise transfer function of the first stage.

9. The method of claim 1, wherein:
   the correction signal is provided by a look-up table which maps possible values of a digital output signal of the first ADC to values for the correction signal.

10. The method of claim 1, wherein:
   the correction signal is provided by a function which takes a digital output signal of the first ADC and outputs a value for the correction signal.

11. The method of claim 1, further comprising:
   processing a digital output signal of the first ADC and the correction signal together by a single digital signal transfer function of the second stage.

12. The method of claim 1, further comprising:
processing a digital output signal of the first ADC by a first digital signal transfer function of the second stage; and
processing the correction signal by a second digital signal transfer function of the second stage.

13. The method of claim 1, further comprising:
converting the correction signal to an analog version of the correction signal using a digital-to-analog converter; and
adding the analog version of the correction signal to an input of the second stage.

14. The method of claim 1, wherein the MASH ADC is a continuous-time MASH ADC.

15. A multi-stage noise shaping analog-to-digital converter (MASH ADC) having cancellation for feedback digital-to-analog converter (DAC) errors, the MASH ADC comprising:
a first stage having a first ADC and a feedback DAC, the first stage generating a digital output signal and an analog signal representing quantization noise of the first stage, wherein a correction signal for correcting an error of the feedback DAC in the first stage is added to the first stage; and
a second stage having a second ADC, the second stage quantizes the analog signal representing the quantization noise of the first stage and generates a digital output signal, wherein the correction signal is added to the second stage;
wherein the MASH ADC subtracts the digital output signal generated by the first stage by the digital output signal of the second stage.

16. The MASH ADC of claim 15, wherein:
the correction signal is added to a digital output signal of the first ADC.

17. The MASH ADC of claim 15, wherein:
the correction signal is added to the digital output signal of the second stage represented by a digital output signal of the second ADC divided by the inter-stage gain factor between the first stage and the second stage.

18. The MASH ADC of claim 15, wherein:
the feedback DAC error of the first stage is substantially cancelled by subtracting the digital output signal generated by the first stage having the correction signal by the digital output signal of the second stage having the correction signal.

19. The MASH ADC of claim 15, further comprising:
a first digital signal transfer function of the second stage for processing a digital output signal of the first ADC; and
a second digital signal transfer function of the second stage for processing the correction signal.

20. The MASH ADC of claim 15, further comprising:
a look-up table for mapping possible values of a digital output signal of the first ADC to values for the correction signal; and/or
a function for taking the digital output signal of the first ADC and outputs a value for the correction signal.

21. The MASH ADC of claim 15, further comprising:
a digital-to-analog converter for converting the correction signal to an analog version of the correction signal, wherein the analog version of the correction signal is added to an input of the second stage.

22. The MASH ADC of claim 15, wherein the MASH ADC is a continuous-time MASH ADC.

23. An apparatus for cancelling feedback digital-to-analog converter (DAC) errors in a multi-stage noise shaping analog-to-digital converter (MASH ADC), the MASH ADC includes a first stage with a first ADC and a feedback DAC and a second stage with a second ADC, the apparatus comprises:
means for adding, to the first stage, an estimated error of the feedback DAC in the first stage, wherein the first stage generates a first digital output signal and an analog signal representing quantization noise of the first stage;
means for adding, the estimated error to the second stage, wherein the second stage quantizes the analog signal representing the quantization noise of the first stage and generates a second digital output signal; and
means for cancelling the error of the feedback DAC in the first stage comprising means for subtracting the first digital output signal by the second digital output signal to generate an output of the MASH ADC.

* * * * *